United States Patent [19]

Odagawa

[11] Patent Number: 5,007,061
[45] Date of Patent: Apr. 9, 1991

[54] BISTABLE SEMICONDUCTOR LASER DIODE DEVICE

[75] Inventor: Tetsufumi Odagawa, Ebina, Japan

[73] Assignee: Fujitsu Limited, Kawasaki, Japan

[21] Appl. No.: 386,266

[22] Filed: Jul. 28, 1989

[30] Foreign Application Priority Data

Jul. 28, 1988 [JP] Japan .................... 63-188925
Jan. 13, 1989 [JP] Japan ...................... 1-6234

[51] Int. Cl.$^5$ ............................ H01S 3/10; H01S 3/19
[52] U.S. Cl. .................................... 372/25; 372/29; 372/30; 372/45
[58] Field of Search ............ 372/45, 46, 20, 25, 372/26, 29, 30, 69, 70, 71, 43

[56] References Cited

U.S. PATENT DOCUMENTS 4,812,776  3/1989  Sasaki ........................ 372/25

FOREIGN PATENT DOCUMENTS 0105391  6/1984  Japan ........................ 372/25
0065224  4/1986  Japan ........................ 372/43
0118731  6/1986  Japan ........................ 372/43
0118732  6/1986  Japan ........................ 372/43

OTHER PUBLICATIONS

K. Inoue & K. Oe, "Optically Triggered Off-Switching in a Bistable Laser Diode Using a Two-Electrode DFB-LD", Electronics Letters, vol. 24, No. 9, Apr. 28, 1988.

Primary Examiner—Georgia Epps
Attorney, Agent, or Firm—Staas & Halsey

[57] ABSTRACT

A bistable semiconductor laser device has reset light irradiation means for irradiating a reset light for stopping the delivery of a lasing light from the laser. The laser comprises an active layer comprising a gain region in which stimulated emission occurs to attain a optical gain and a saturable absorption region in which no optical gain is attained at the lasing wavelength, resetting of the laser being carried out by irradiating onto the gain region of the laser a light having a wavelength in accordance with which the irradiated light is amplified by stimulated emission thereby to reduce carriers in the gain region of the laser.

17 Claims, 18 Drawing Sheets

BASIS OF PRESENT INVENTION (SAME AXIS CASE)

OSCILLATION WITH BEAT FREQUENCY

GAIN CHANGE IN SATURABLE ABSORPTION REGION

BASIS OF PRESENT INVENTION (SAME AXIS CASE)

BASIS OF PRESENT INVENTION (DIFFERENT AXIS CASE)

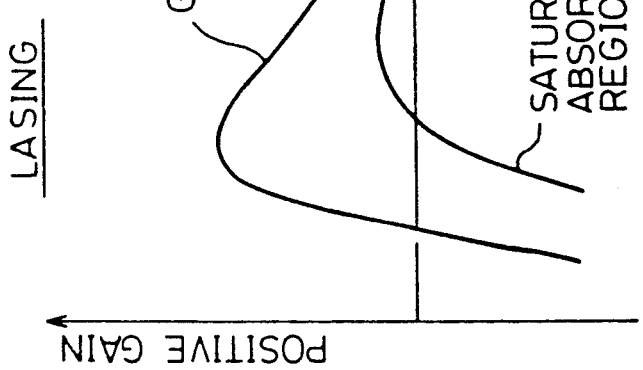
Fig. 14B LASING
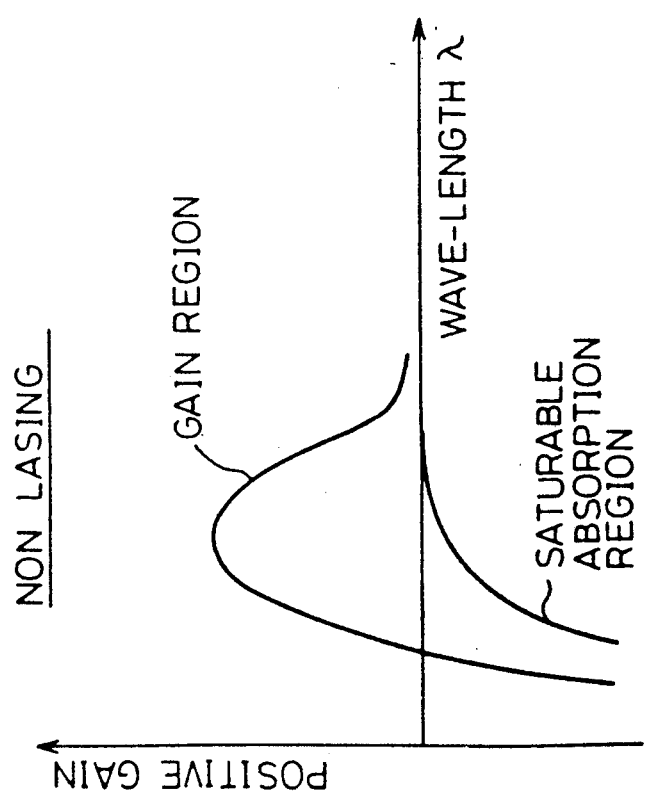
Fig. 14A NON LASING

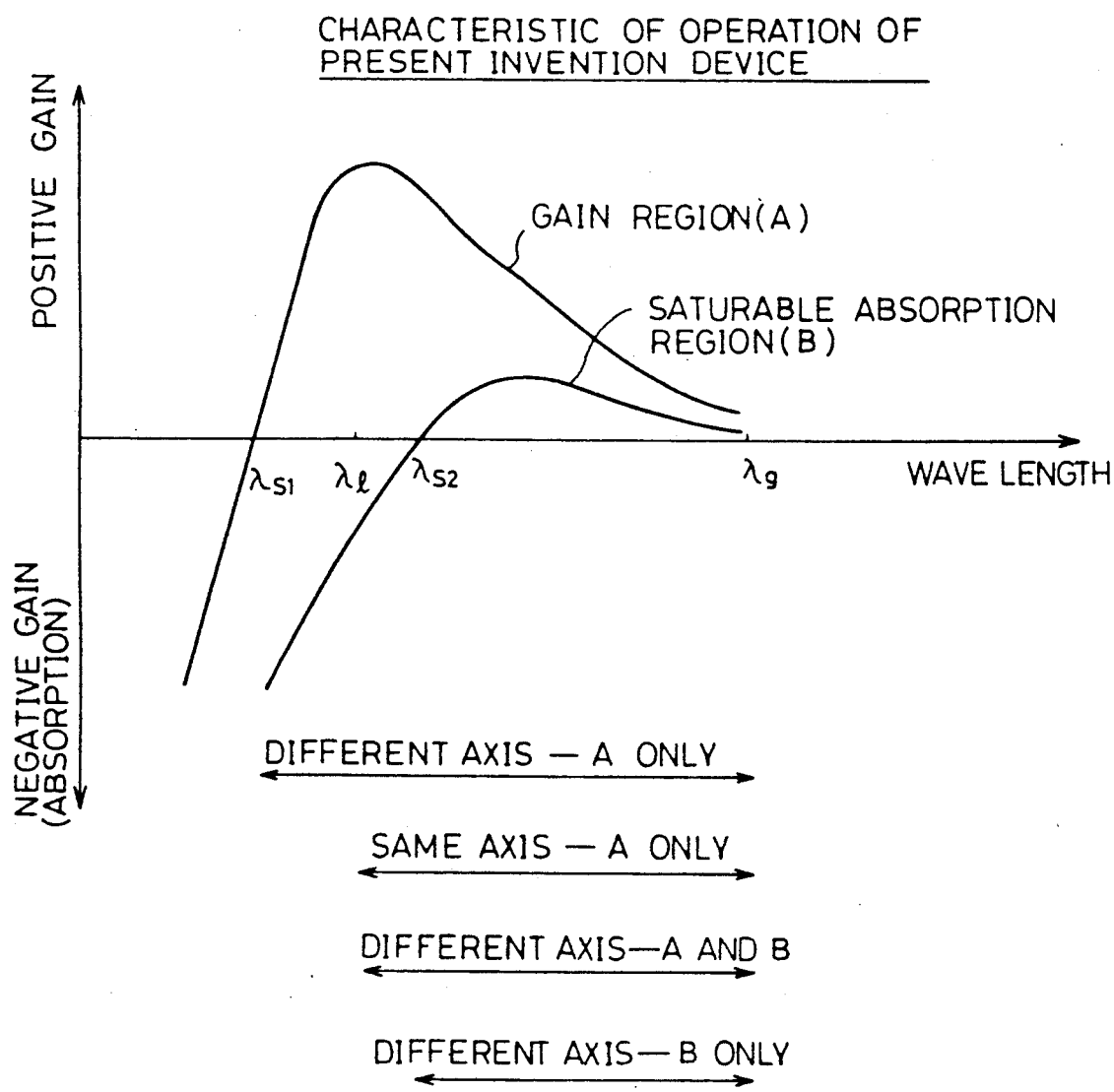

SETTING

RESETTING (CASE-1) BORDER LINE OF SETTABLE RANGE (CASE-2) BORDER LINE OF RESETTABLE RANGE (CASE-3) RESULTANT BORDER LINE (PRIORITY FOR LOWER VALUE)

(CASE-1) BISTABLE LASER DEVICE IN "SAME AXIS" MANNER (CASE-2) BISTABLE LASER DEVICE IN "DIFFERENT AXIS" MANNER (CASE-3) BISTABLE LASER WITH ELECTRICAL SETTING AND OPTICAL RESETTING

LASER CHARACTERISTIC

RESET LIGHT INTENSITY DISTRIBUTION

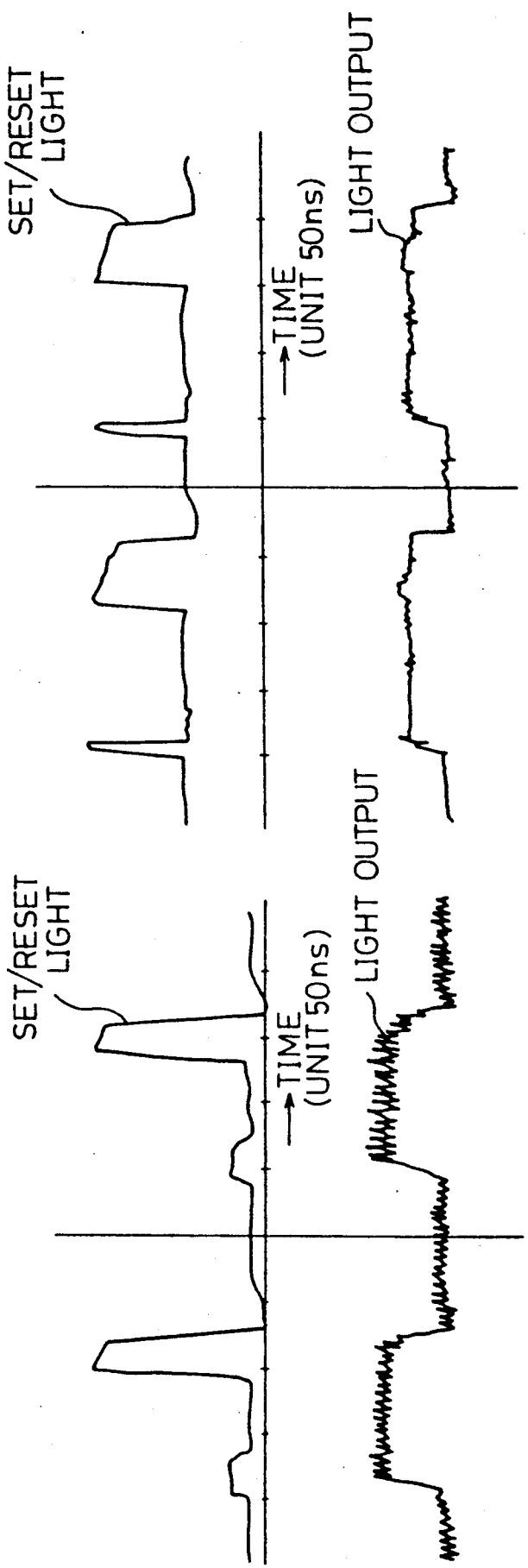
Fig. 26A (CASE-1)
Fig. 26B (CASE-2)

BISTABLE SEMICONDUCTOR LASER DIODE DEVICE

BACKGROUND OF THE INVENTION

1. Field of the Invention

The present invention relates to a bistable semiconductor laser diode device. The bistable semiconductor laser diode device is used, for example, for an optical communication system in a local area network (LAN).

2. Description of the Related Arts

In general, a bistable semiconductor laser is constituted by a laminated structure of an N-side electrode, an N-type layer, an active layer, a P-type layer, and a P-side electrode. This laminated structure is horizontally divided into two regions, that is, the gain region and the saturable absorption region. The gain region has a laminated structure of an N-side electrode, an N-type layer, an active layer, a P-type layer, and a P-side electrode. The saturable absorption region has a laminated structure of an N-side electrode, an N-type layer, an active layer, and a P-type layer, but does not have a P-side electrode. In the gain region, electric current passing between the N-side and P-side electrodes causes a stimulated emission in the active layer so that a light gain is attained, while, in the saturable absorption region, no electric current passes through the N-type layer, the active layer, and the P-type layer so that no light gain is attained.

As to the characteristic of the carrier concentration in the active layer versus the gain, in the range where the carrier concentration in the active layer is low, the gain assumes a negative gain value revealing the absorption state, while in the range where the carrier concentration in the active layer is high, the gain assumes a positive value revealing the stimulated emission state to cause a laser oscillation so that the light amplification function is achieved.

In the saturable absorption region, as the intensity of the light increases, the degree of the absorption decreases, and the gain approaches from a negative value to the saturated value close to zero. However, the gain does not assume a positive value, since the saturable absorption region does not have any pumping mechanism.

The bistable semiconductor laser device has a hysteresis characteristic, and it is possible to carry out a resetting operation of the device either by electrical means or by optical means. It has been proposed that, as one of the optical resetting means, the bistable semiconductor laser device is brought to the beat oscillation state by using neighboring frequencies to attain a resetting.

For example, a reference can be made to K. Inoue and K. Oe; "Optically Triggered Off-Switching in a Bistable Laser Diode Using a Two-Electrode DFB-LD", Electronics Letters Vol. 24, No. 9, Apr. 28, 1988. In this optical resetting method, when two frequencies are very close to each other, the total light output is changed with the beat frequency of the two frequencies. If the light output becomes lower than a predetermined value, the carrier pumping in the saturable absorption region will be decreased to reduce the carrier concentration and to increase the light absorption. If the degree of the light absorption becomes higher than a predetermined value, it will become impossible to maintain the laser oscillation to cause the resetting of the device.

However, the above-mentioned prior art electrical or optical resetting method has problems that, in the case of the electrical resetting, the use of an electrical signal for control will cause electrical noises which disturb the neighboring circuits and, particularly in integrated circuit devices, will cause cross-talk between electrical wirings, and, in the case of the optical resetting using the beat frequency, there is a difficult requirement to make the motion of the carriers follow the period of the beat oscillation which requires the control of the wavelength of the irradiation light with quite a high resolution such as a wavelength difference of the order of 0.1 angstrom.

Also, the above-mentioned prior art optical resetting method has a problem that the frequency beat cannot be satisfactorily attained when a reset light is injected into the active layer of the laser along an axis different from the lasing light axis and accordingly the resetting cannot be attained.

SUMMARY OF THE INVENTION

It is an object of the present invention to provide an improved bistable semiconductor laser diode device in which the optical resetting of the device is carried out over a very broad range of the wavelength of an injection light without severe requirements for the precision of the wavelength.

It is another object of the present invention to provide an improved bistable semiconductor laser diode device in which the optical resetting of the device is carried out in accordance with the light wavelength versus light intensity characteristic and the choice of the irradiation light axis.

It is another object of the present invention to carry out both the setting and the resetting of a bistable semiconductor laser diode device by a single wavelength of light and a relatively low intensity of light.

It is another object of the present invention to provide an improved light signal inverter using a bistable semiconductor laser diode device with the optical resetting.

In accordance with the present invention, there is provided a bistable semiconductor laser diode device having reset light irradiation means for irradiating a reset light to stop the delivery of a lasing light from the laser, in which the laser includes an active layer comprising a gain region in which a stimulated emission occurs to attain an optical gain, and a saturable absorption region in which no stimulated emission occurs so as not to attain optical gain at a lasing wavelength, a resetting of the laser being carried out by irradiating onto the gain region of the laser a light having a wavelength by means of which the irradiated light is able to be amplified by a stimulated emission to reduce carriers in the gain region of the laser.

Also, there is provided a bistable semiconductor laser diode device comprising a bistable semiconductor laser, set light irradiation means for irradiating a set light causing a lasing light to be delivered from the laser, and reset light irradiation means for irradiating a reset light to stop the delivery of the lasing light from the laser due to a reduction of carriers by amplification of light by stimulated emission; in which the bistable semiconductor laser includes an active layer consisting of a gain region having a portion to which carriers are supplied from outside, and a saturable absorption region not having portions to which carriers are supplied from outside, clad layers formed on both sides of the active layer and having a refractive index smaller than that of the active layer, and a carrier supply portion arranged on the clad layers in correspondence with the portion to which the carriers are supplied. The reset light irradiation means is arranged to irradiate the reset light selectively onto a predetermined region of the active layer along a direction having a predetermined relationship with the lasing light axis of the laser; and the reset light has a wavelength and a border value (threshold) of light intensity which satisfy a predetermined condition concerning the gain or the absorption in the gain region or the saturable absorption region, and a predetermined relationship with regard to the border value (threshold) of set light intensity having the same wavelength as the wavelength of the reset light.

Also, there is provided a bistable semiconductor laser comprising a gain region having a portion to which carriers are supplied from outside and a saturable absorption region not having a portion to which carriers are supplied from outside, in which the setting or resetting of the bistable semiconductor laser is carried out by irradiating onto gain region of the laser a light having a wavelength around the border of a settable wavelength range and a resettable wavelength range to set or reset the bistable semiconductor laser, and the resetting of the bistable semiconductor laser is carried out by a reduction of carriers by amplification of light by stimulated emission.

BRIEF DESCRIPTION OF THE DRAWINGS

In the drawings,

FIG. 9 shows a cross-sectional view, FIG. 10 shows a plan view, and FIG. 11 shows a perspective view;

FIG. 12 shows a cross-sectional view and FIG. 13 shows plan view;

FIGS. 14A and 14B are diagrams for illustrating the basis of the operation of the bistable semiconductor laser of the present invention;

FIG. 15 is a diagram illustrating the characteristic of operation of the bistable semiconductor laser of the present invention;

DESCRIPTION OF THE PREFERRED EMBODIMENT (Preliminary Explanation)

Figure 1:
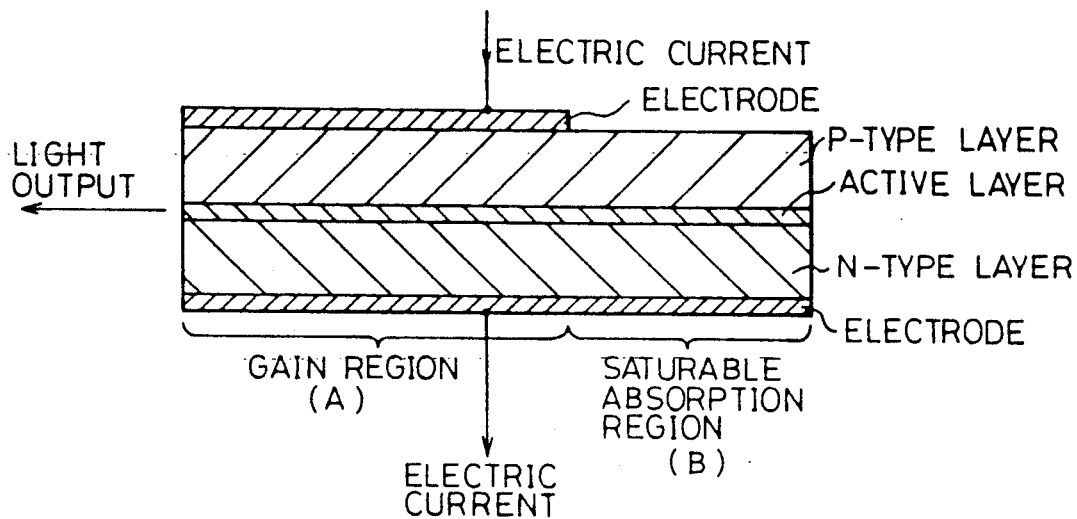
FIG. 1 is a cross-sectional view of a prior art bistable semiconductor laser.

Before describing the preferred embodiment, prior art bistable semiconductor laser devices will be explained with reference to FIGS. 1 to 6. In general, the structure of a bistable semiconductor laser is, as shown in FIG. 1, a laminated structure of an N-side electrode, an N-type layer, an active layer, a P-type layer, and a P-side electrode. This laminated structure is horizontally divided into two regions, that is the gain region and the saturable absorption region. The gain region has a laminated structure of an N-side electrode, an N-type layer, an active layer, a P-type layer, and a P-side electrode. The saturable absorption region has a laminated structure of an N-side electrode, an N-type layer, an active layer, and a P-type layer, but does not have a P-side electrode. In the gain region, electric current passing between the N-side and P-side electrodes causes a population inversion in the active layer so that a light gain is attained, while, in the saturable absorption region, no electric current passes through the N-type layer, the active layer, and the P-type layer and thus no light gain is attained in the EL (non-lasing) state.

Figure 2:
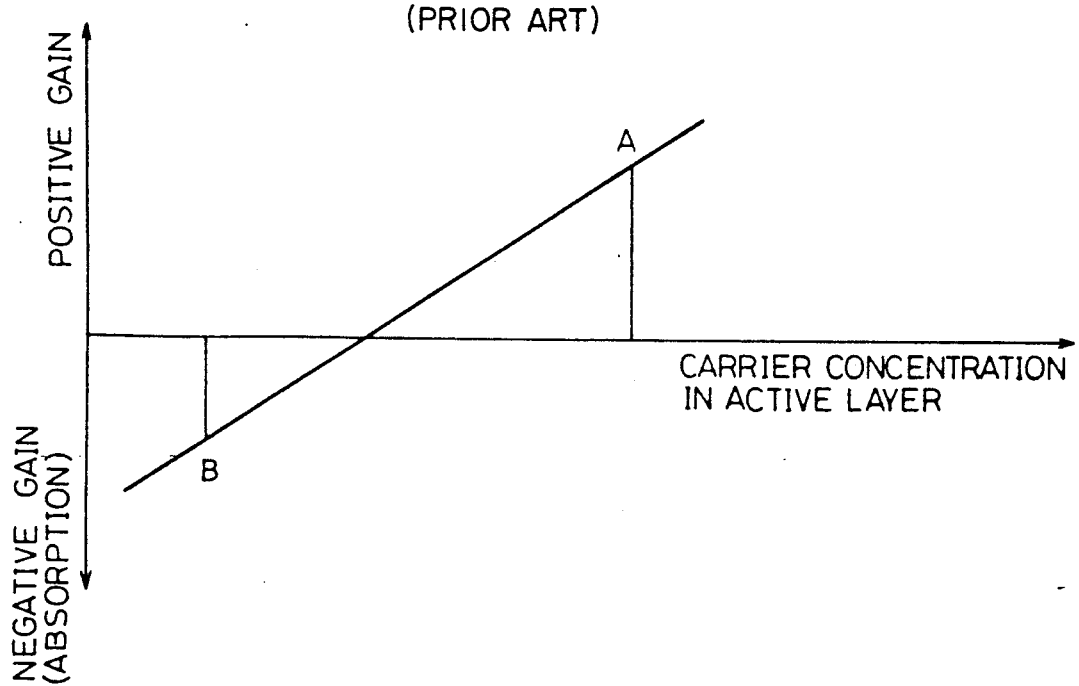
FIG. 2 is a diagram showing the carrier concentration versus gain characteristic of the bistable semiconductor laser.

As to the characteristic of the carrier concentration in the active layer versus the gain of the device of FIG. 1, as shown in FIG. 2, in the range (B) where the carrier concentration in the active layer is low, the gain assumes a negative gain value revealing the absorption state, while in the range (A) where the carrier concentration in the active layer is high, the gain assumes a positive value revealing the stimulated emission state to cause a laser oscillation so that the light amplification function is achieved.

Figure 3:
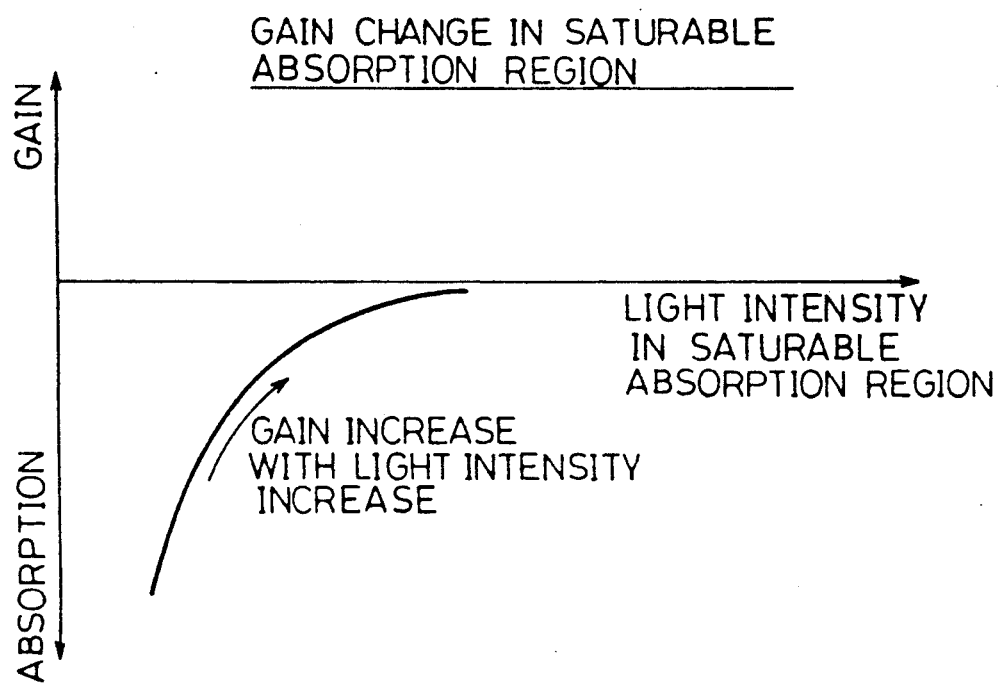
FIG. 3 is a diagram showing the light intensity versus gain change in the saturable absorption region in the bistable semiconductor laser.

In the saturable absorption region of the device of FIG. 1, as shown in FIG. 3, as the intensity of the light increases, the degree of the absorption decreases and the gain approaches from a negative value to the saturated value close to zero. However, the gain does not assume a positive value at the wavelength of the light.

Figure 4:
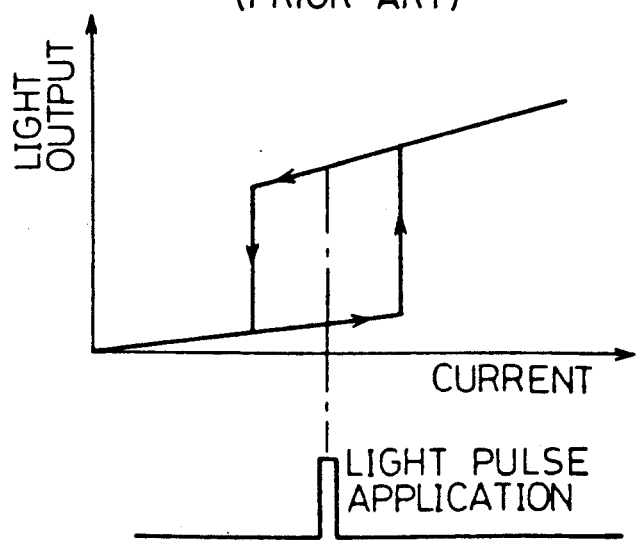
FIG. 4 is a diagram showing the light resetting operation for the bistable semiconductor laser.
Figure 5:
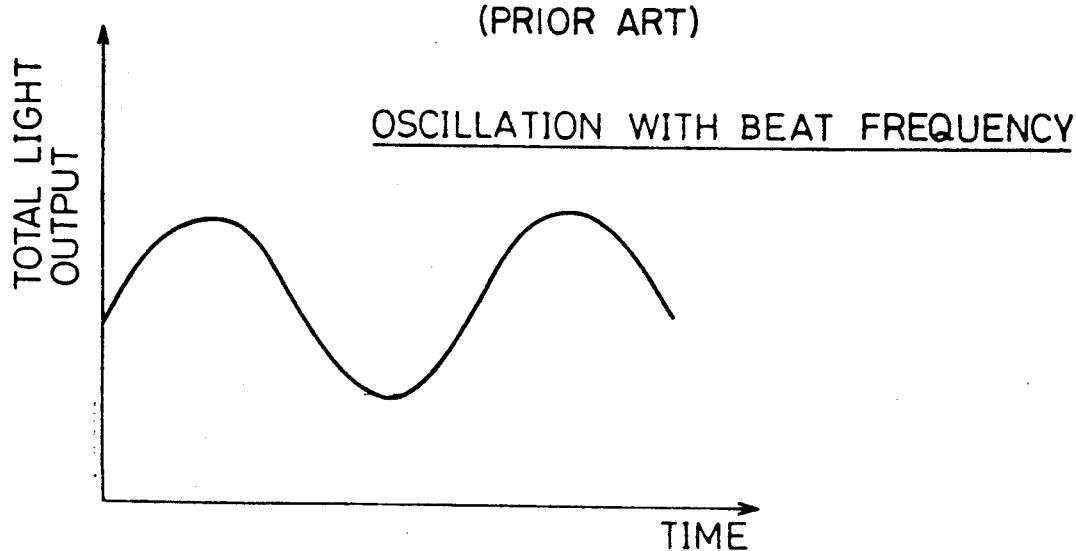
FIG. 5 is a diagram showing the oscillation with beat frequency of the total light output of the bistable semiconductor laser.
Figure 6:
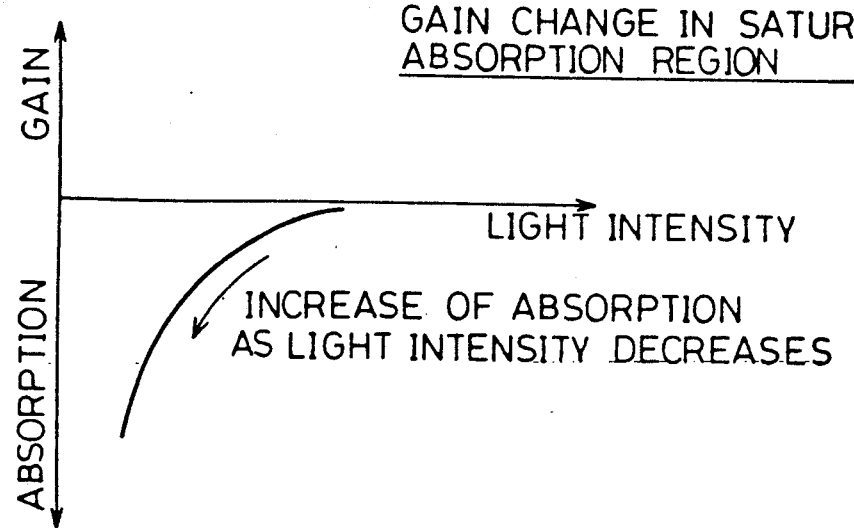
FIG. 6 is a diagram showing the gain change in the saturable absorption region in the bistable semiconductor laser.

The bistable semiconductor laser diode device has a hysteresis characteristic, as shown in FIG. 4, and it is possible to carry out a resetting operation of the device either by electrical means or by optical means. It has been proposed that, as one of the optical resetting methods, the bistable semiconductor laser diode device is brought to the beat oscillation state by using neighboring frequencies to attain a resetting. In the optical resetting method, as shown in FIG. 5, when two frequencies are very close to each other, the total light output is changed with the beat frequency of the two frequencies. If the light output becomes lower than a predetermined value, the carrier pumping in the saturable absorption region will be decreased to reduce the carrier concentration to increase the light absorption. If the degree of the light absorption becomes higher than a predetermined value, it will become impossible to maintain the laser oscillation to cause the resetting of the laser.

(Basis and Examples of the Laser Device of the Present Invention)

Figure 7:
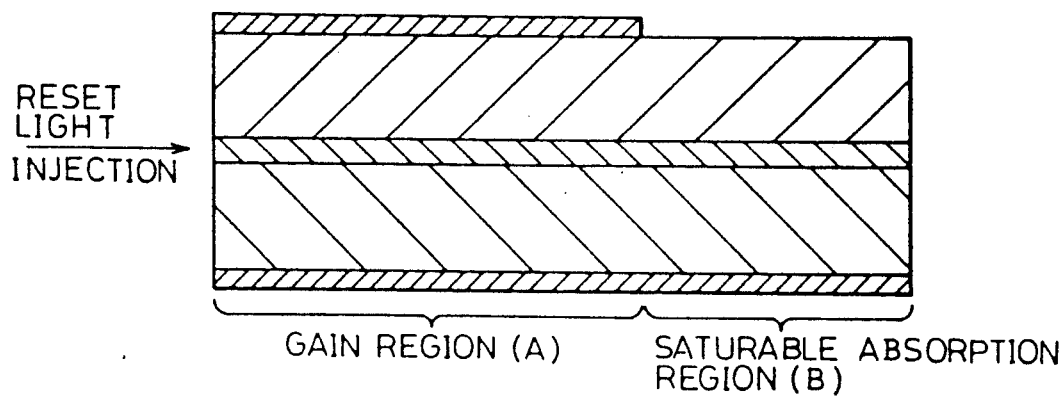
FIG. 7 is a cross-sectional view of a bistable semiconductor laser, illustrating the basis of the present invention, in the case where the axis of the reset light irradiation is the same as the light axis of the laser.

The basis of the bistable semiconductor laser diode device of the present invention will be explained with reference to FIGS. 7 and 8. In FIG. 7, light having a wavelength at which the active layer has a gain coefficient, is irradiated onto the active layer of the laser and the number of carriers in the gain region is reduced, so that the resetting of the laser diode device is carried out.

In the laser diode device of FIG. 7, the axis of the irradiation light is the same as the axis of the laser light output from the laser diode device ("same axis" case).

Figure 8:
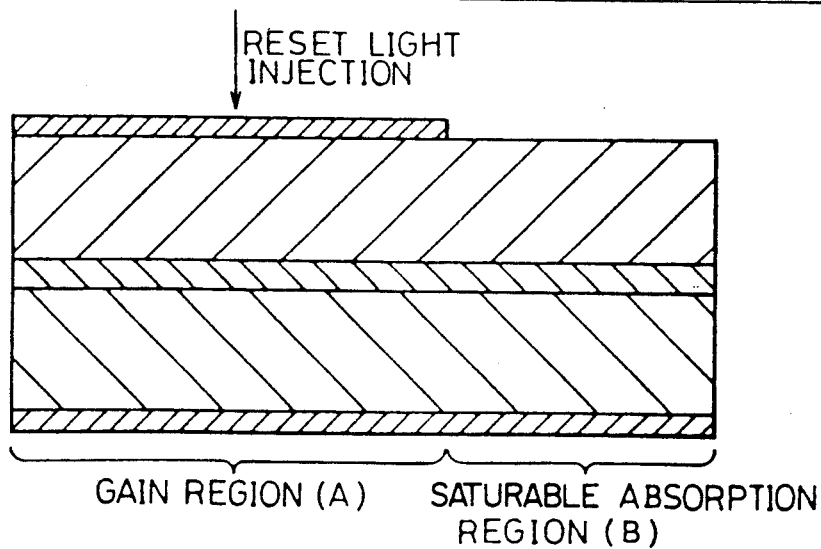
FIG. 8 is a cross-sectional view of a bistable semiconductor laser, illustrating the basis of the present invention, in the case where the axis of the reset light irradiation is different from the light axis of the laser.

In the case of FIG. 8, the axis of the irradiation light is different from the axis of the output laser light from the laser device ("different axis" case).

Figure 9:
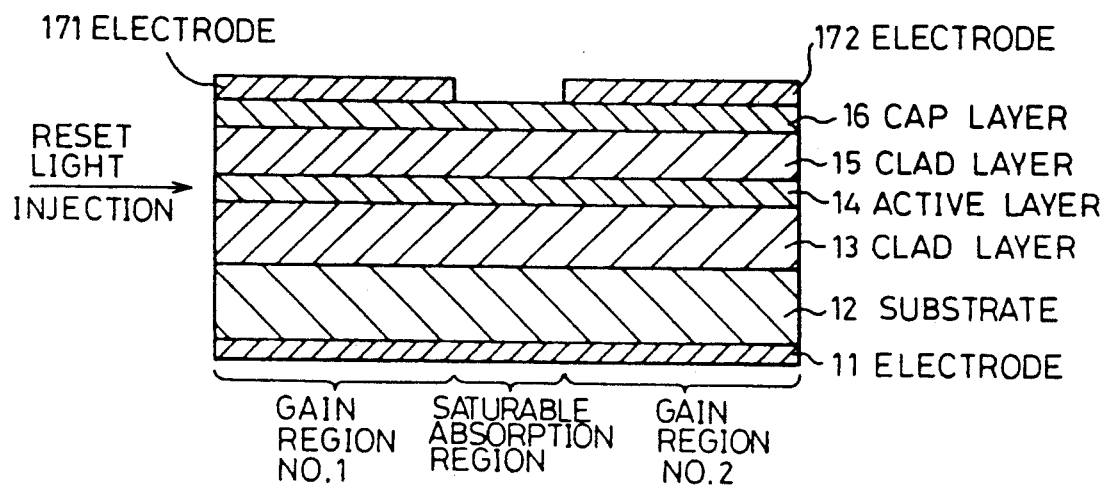
FIGS. 9, 10, and 11 show the structure of a bistable semiconductor laser, according to an embodiment of the present invention where
Figure 10:
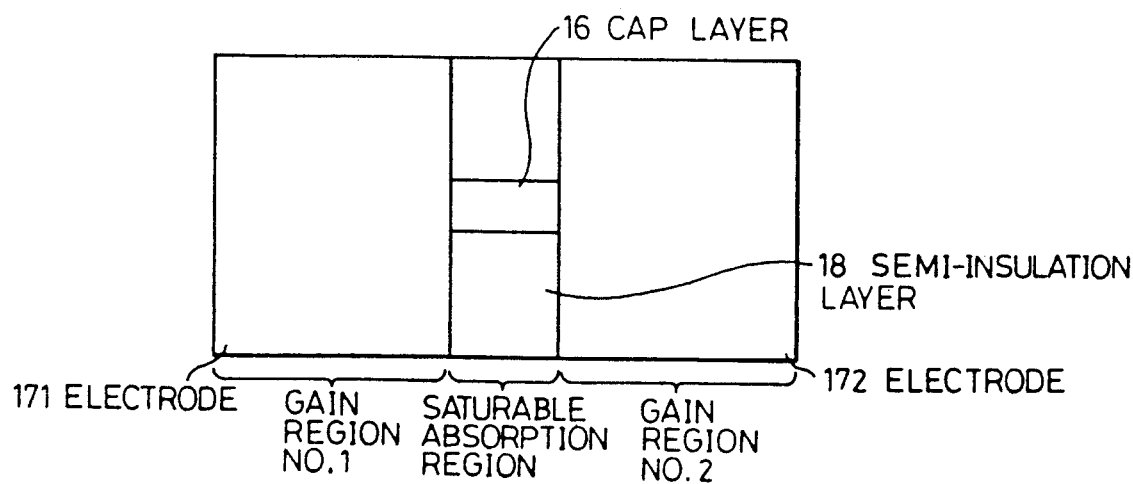
Figure 11:
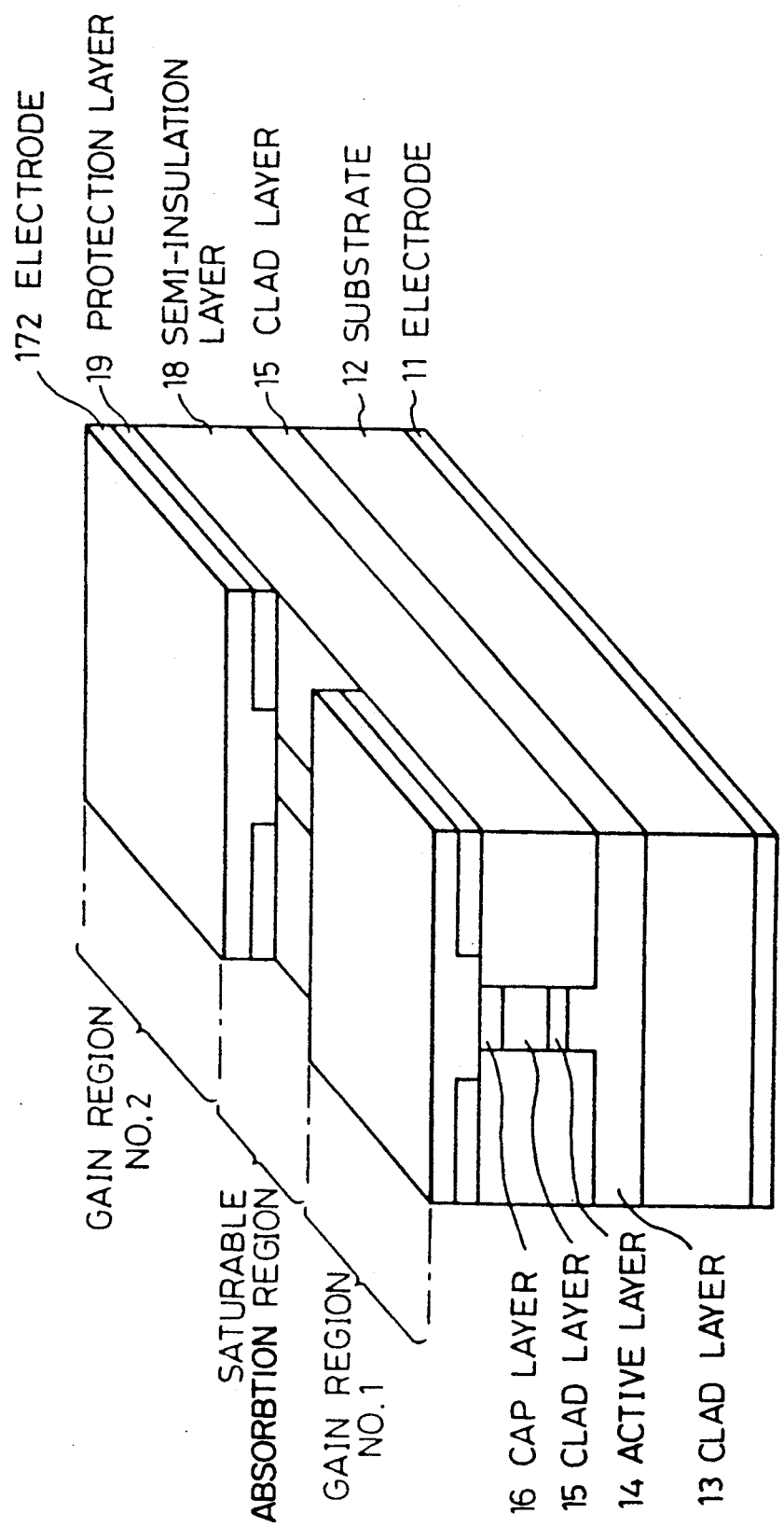

A bistable semiconductor laser diode device according to an embodiment of the present invention is shown in FIGS. 9, 10, and 11, where FIG. 9 is a cross-sectional view, FIG. 10 a plan view, and FIG. 11 a perspective view. This device is of the "same axis" type.

The bistable semiconductor laser diode device of FIG. 9 is constituted by the gain regions No. 1 and No. 2, and a saturable absorption region. The device has a laminated structure of electrode 11, substrate 12, clad layer 13, active layer 14, clad layer 15, cap layer 16, and electrodes 171 and 172.

The device has also a semi insulation layer 18 and protection layer 19. The substrate 12 is of N-type InP, the clad layer 13 N-type InP, the active layer 14 P-type InGaAs, the clad layer 15 P-type InP, the cap layer 16 P+-type InGaAsP, the semi insulation layer 18 InP, and the protection layer 19 SiO$_2$.

Figure 12:
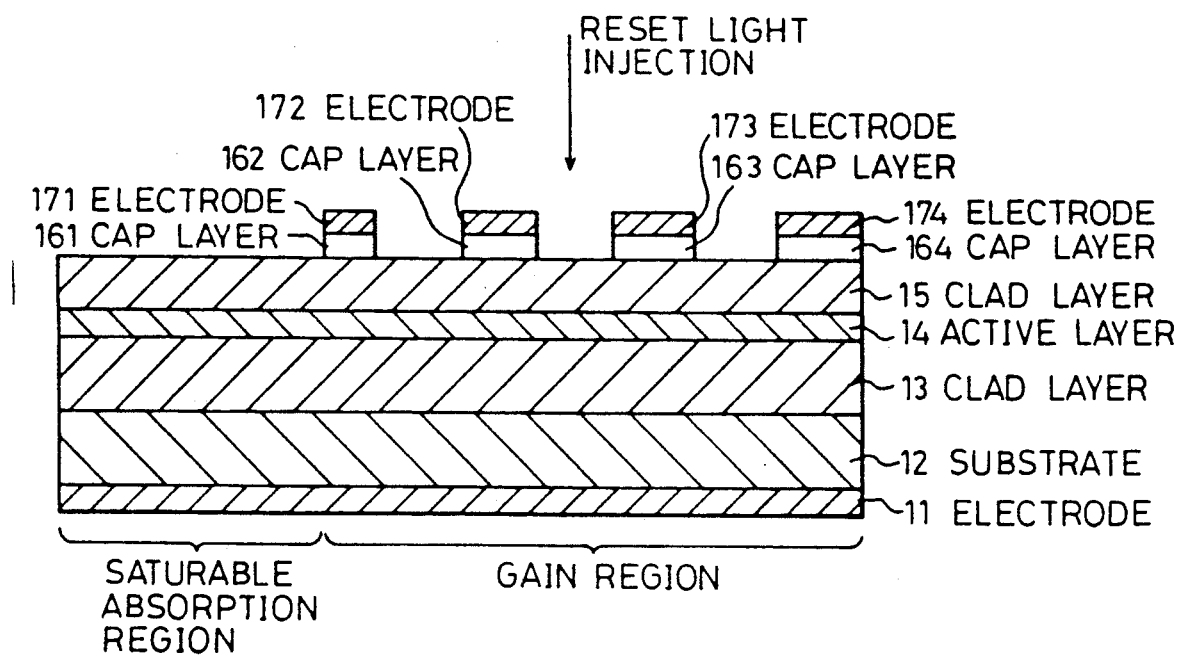
FIGS. 12 and 13 show the structure of a bistable semiconductor laser, according to an embodiment of the present invention, where
Figure 13:
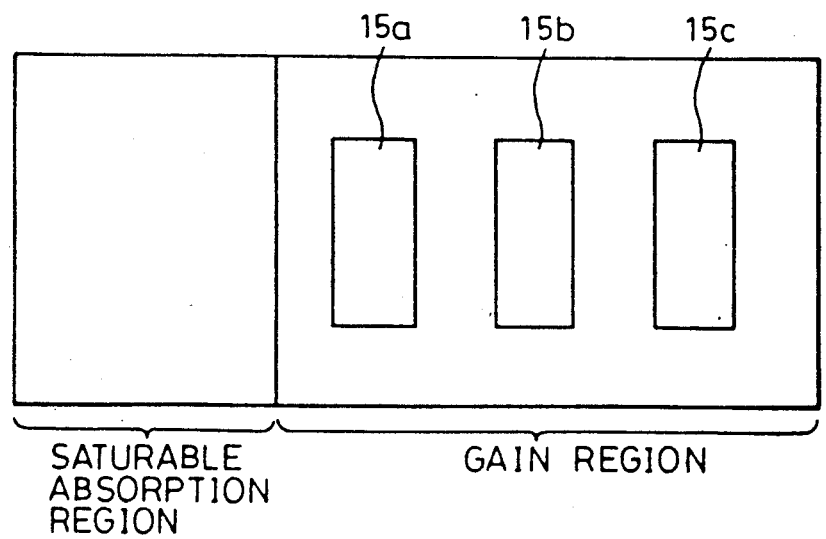

A bistable semiconductor laser diode device according to another embodiment of the present invention is shown in FIGS. 12 and 13, where FIG. 12 is a cross-sectional view, and FIG. 13 a plan view. This device is of the "different axis" type.

The bistable semiconductor laser device of FIG. 12 is constituted by the gain region and a saturable absorption region. The device has a laminated structure of electrode 11, substrate 12, clad layer 13, active layer 14, clad layer 15, cap layers 161, 162, 163, and 164, and electrodes 171, 172, 173, and 174.

Openings 15a, 15b, and 15c are formed in the upper electrode and the cap layer. The light irradiation for resetting is irradiated toward the active layer 14 through these openings 15a, 15b, and 15c.

(Wavelength versus Gain Characteristic)

The wavelength versus gain characteristic of the gain region and the saturable absorption region of the device of the present invention is shown in FIGS. 14A, 14B and 15.

In the non-lasing state, the wavelength versus gain characteristic of the gain region and the saturable absorption region are as shown in the left part of FIG. 14A. In the non-lasing state, the gain region can attain a positive gain, but the saturable absorption region cannot attain positive gains but only negative gains, constituting an absorption state.

In the lasing state, the wavelength versus gain characteristics of the gain region and the saturable absorption region are as shown in FIG. 14B and FIG. 15. The upper curve represents the gain spectrum in the gain region, and the lower curve represents the gain spectrum in the saturable absorption region. The gap wavelength $\lambda_g$, the laser wavelength $\lambda_l$, and specific values $\lambda_{s1}$ and $\lambda_{s2}$ of wavelength are indicated. The $\lambda_{s1}$ is defined as the wavelength at which the gain coefficient of gain region is zero, and the $\lambda_{s2}$ is defined as the wavelength at which the gain coefficient of the saturable absorption region is zero.

The first condition of the device with the reset light axis of the different axis type by the operation of only the gain region covers the range from $\lambda_{s1}$ to $\lambda_g$. The second condition of the device with the reset light axis of the same axis type covers the range from $\lambda_l$ to $\lambda_g$. The third condition of the device with the reset light axis of the different axis type by the operation of both the gain region and the saturable absorption region covers the range from $\lambda_l$ to $\lambda_g$. The fourth condition of the device with the reset light axis of the different axis type by the operation of only the saturable absorption region covers the range from $\lambda_{s2}$ to $\lambda_g$.

(Light Intensities Required for Setting and Resetting)

Figure 16A:
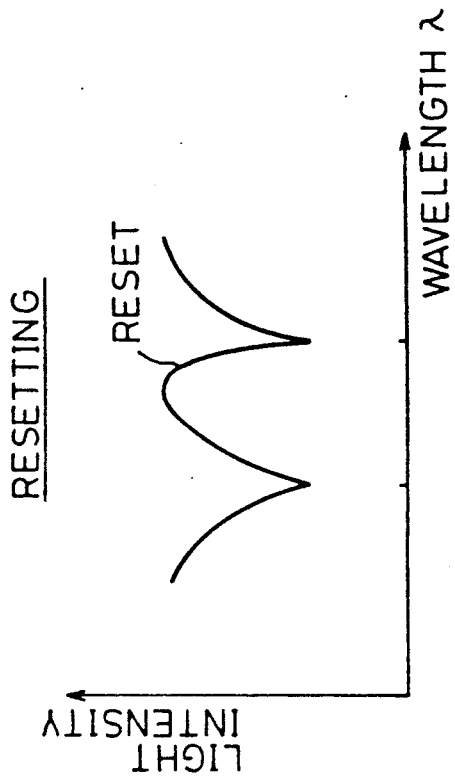
FIGS. 16A and 16B are also diagrams for illustrating the basis of the operation of the bistable semiconductor laser of the present invention; .

The wavelength dependence of the injected light intensity required for the setting of the device is represented by the solid line curve of FIG. 16A. The wavelength dependence of the injected light intensity required for the resetting of the device is added by the broken line curve as a reference.

Figure 16B:
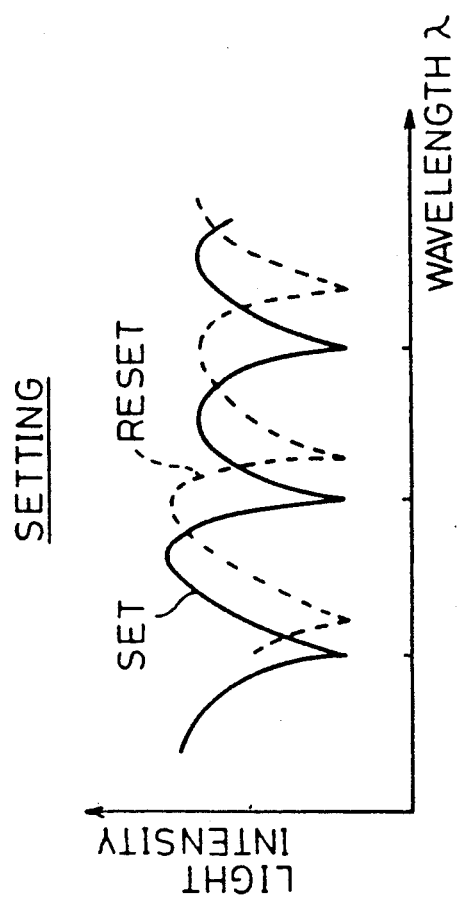

The wavelength dependence of the irradiated light intensity required for the resetting of the device is represented by the solid line curve of FIG. 16B.

In the light intensity characteristic shown in FIG. 16A concerning the solid rset line and the broken set line, since two values cannot exist for each wavelength value, only the lower value of the solid line value and the broken line value can exist for each wavelength value. This situation will be further explained with reference to FIG. 17.

(Border Lines of Settable and Resettable Ranges)

Figure 17A:
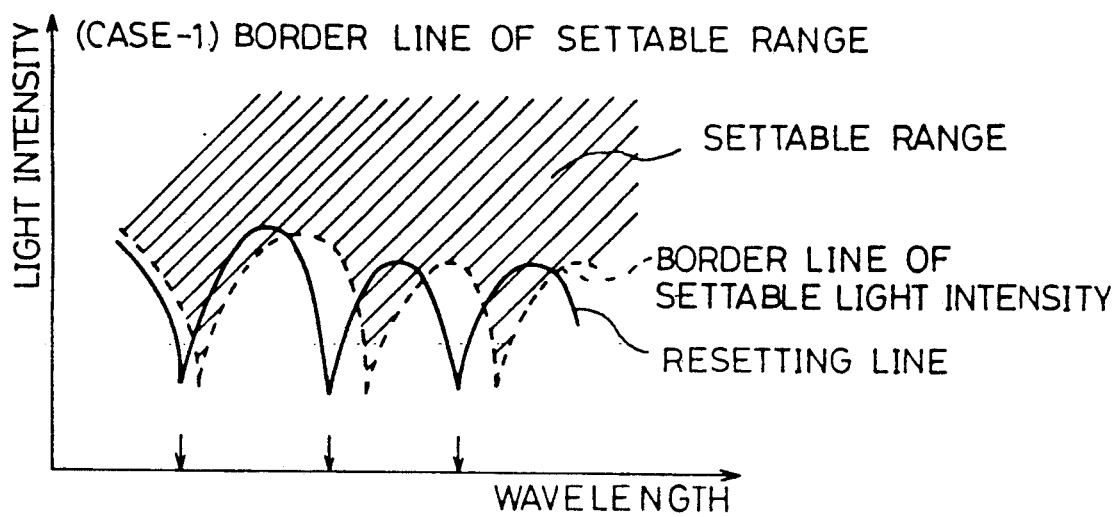
FIGS. 17A and 17B are diagrams showing the wavelength versus irradiated light intensity characteristic of the bistable semiconductor laser of the present invention.
Figure 17B:
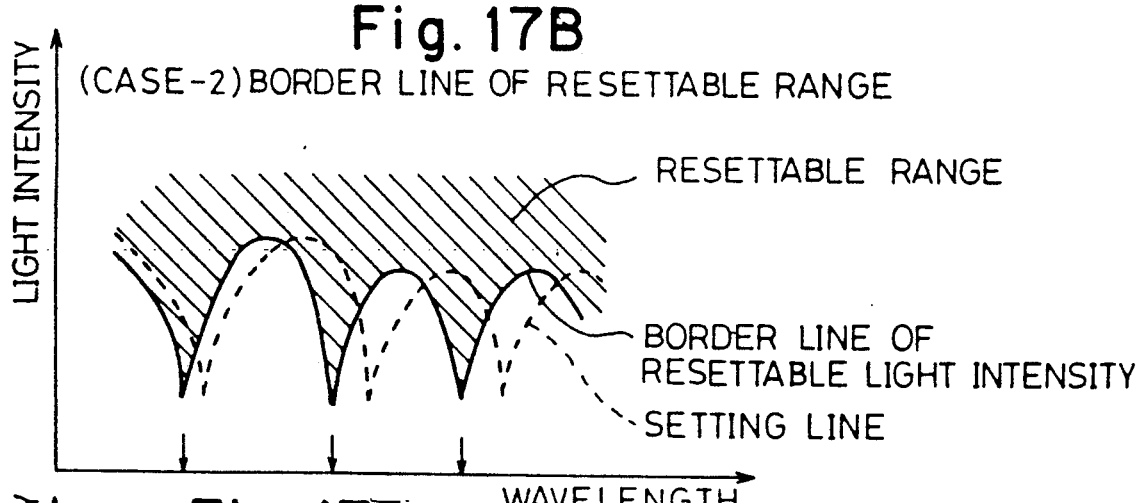
Figure 17C:
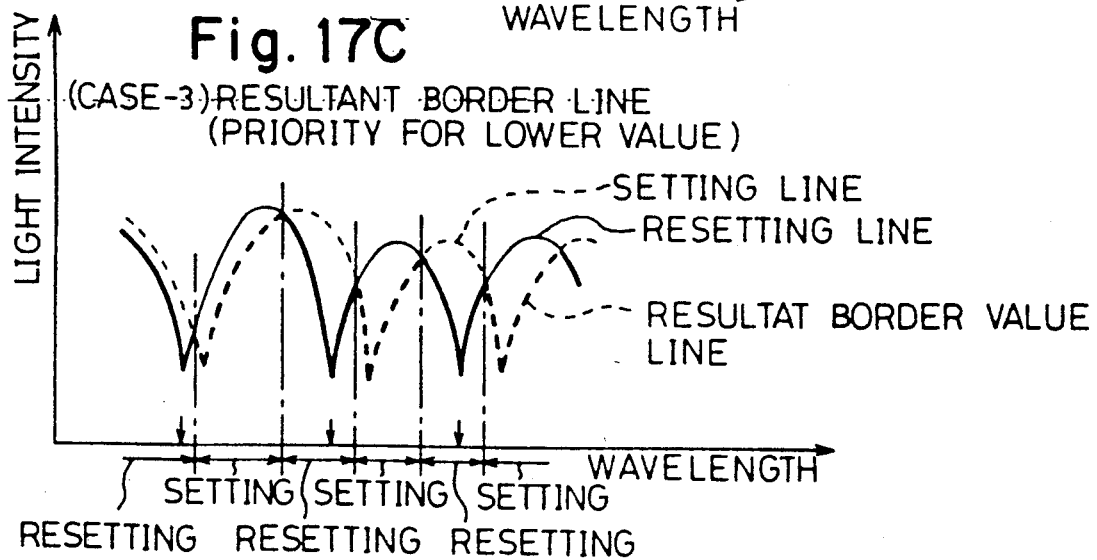

The determination of the border lines (threshold) of light intensity of settable and resettable ranges in the operation of the device of the present invention is illustrated in Case-1, Case-2, and Case-3 of FIGS. 17A, 17B and 17C, respectively, in each of which the abscissa represents wavelength and the ordinate represents light intensity.

In Case-1 of FIG. 17A, the broken line represents the border value (threshold) of settable light intensity, the range above the broken line having hatchings represents the settable range, and the solid line represents the resetting line.

In Case-2 of FIG. 17B, the solid line represents the border value of resettable light intensity, the range above the solid line having hatchings represents the resettable range, and the broken line represents the setting line.

In Case-3 of FIG. 17C, the broken line represents the setting characteristic, the solid line represents the resetting characteristic, and the sequence of the thickened solid line segments and the thickened broken line segments represents the resultant border line.

(Use of Light Having Wavelength About the Borders of Settable Wavelength Range and Resettable Wavelength Range)

Figure 18:
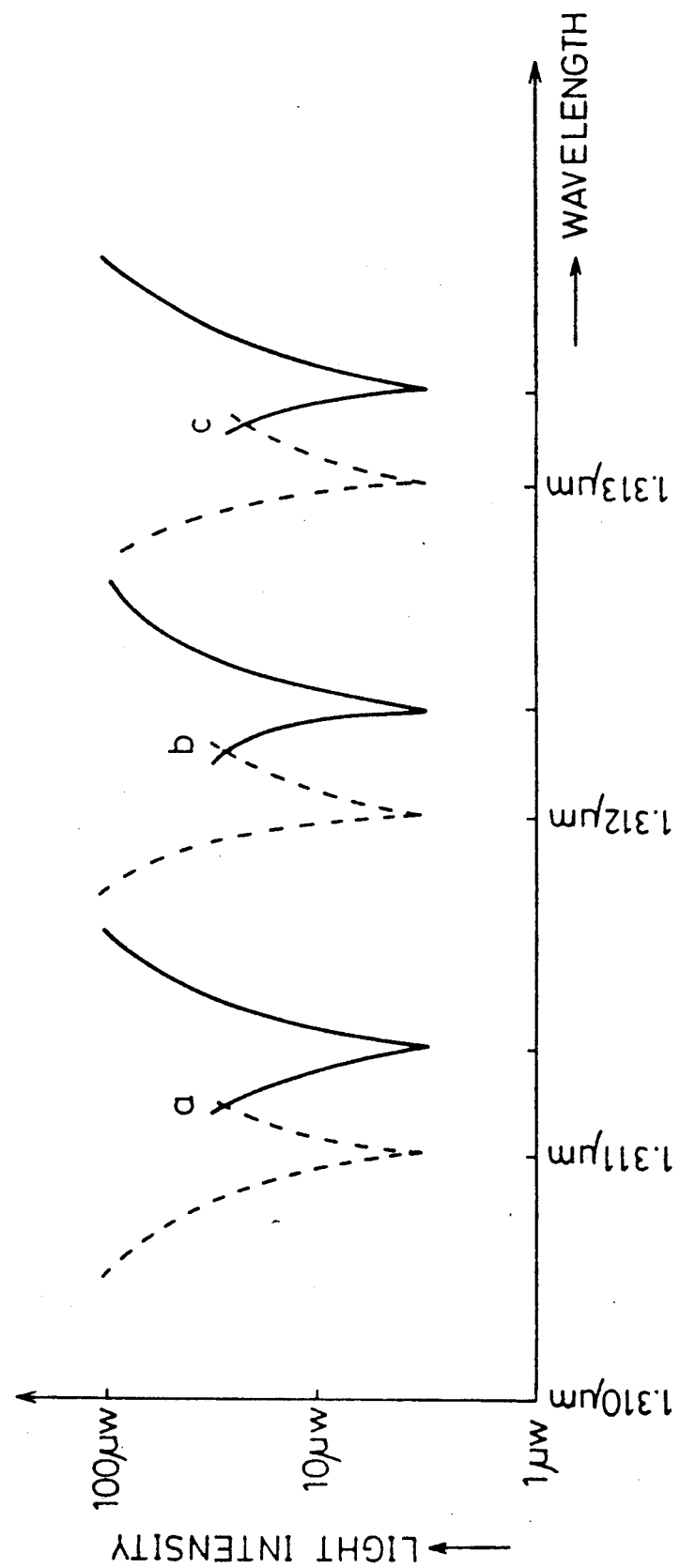
FIG. 18 is a diagram showing the wavelength versus light intensity characteristic of the bistable semiconductor laser according to an embodiment of the present invention.

In a bistable semiconductor laser diode device according to an embodiment of the present invention, it is possible to use a light having a wavelength about the borders which is of the settable wavelength range and the resettable wavelength range. The characteristic of the operation of this device is shown in FIG. 18. The points of the wavelength at the borders of the settable wavelength range and the resettable wavelength range are indicated as "a", "b", and "c" in FIG. 18.

The light having a wavelength about a point such as "a", "b", or "c" is used for setting or resetting the bistable semiconductor diode laser device.

Figure 19:
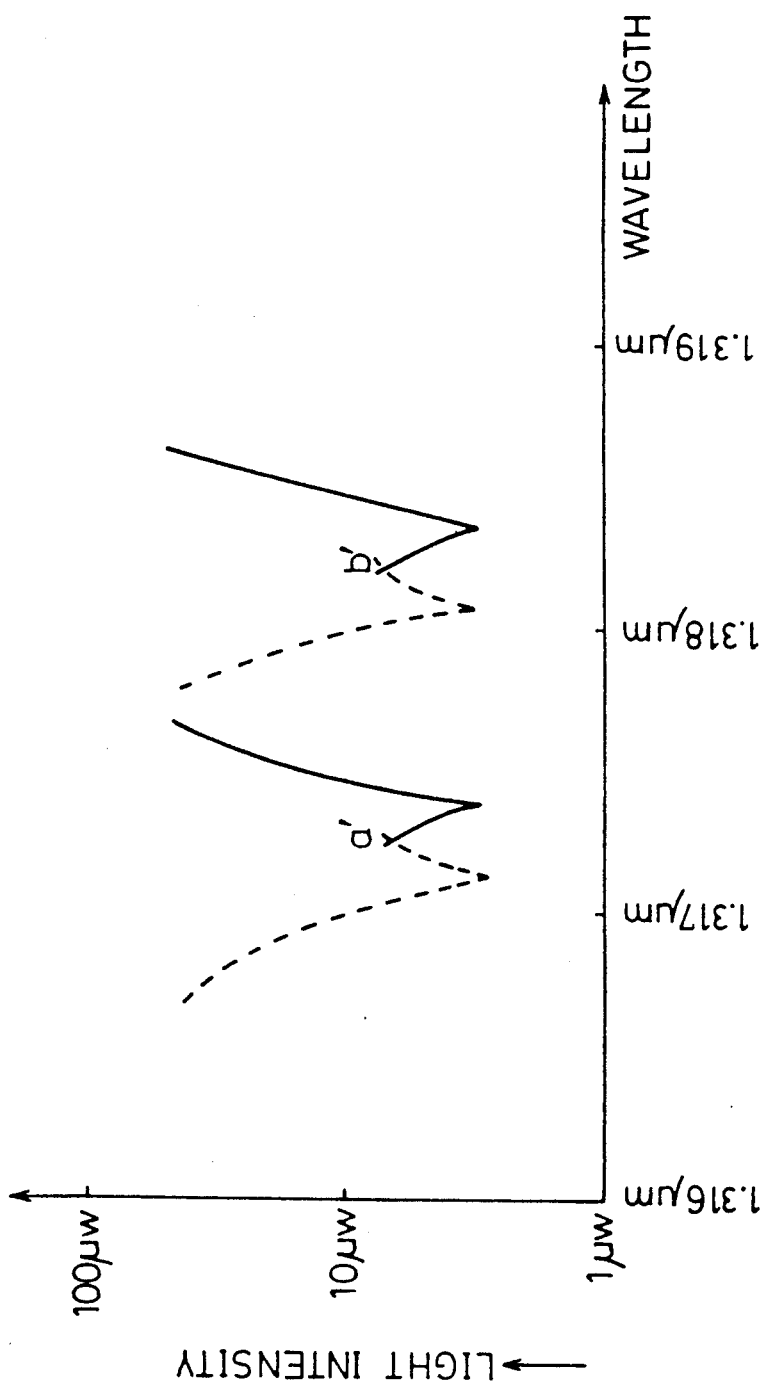
FIG. 19 is a diagram showing the wavelength versus light intensity characteristic of the bistable semiconductor laser according to an embodiment of the present invention.

It is possible to use the operation characteristic shown in FIG. 19. In the operation characteristic of FIG. 19, the wavelength of the light for setting or resetting is selected as a wavelength in the border range where the difference between the resonance wavelength for a non-lasing state of the laser and the resonance wavelength for a lasing state of the laser is 1 angstrom or less.

(Examples of Types of Device, Actual Operation of the Device, etc.)

Figure 20A:
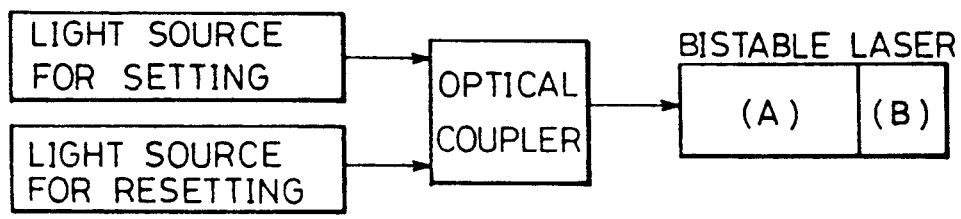
FIGS. 20A, 20B and 20C show example of the types of the bistable semiconductor laser device of the present invention.
Figure 20B:
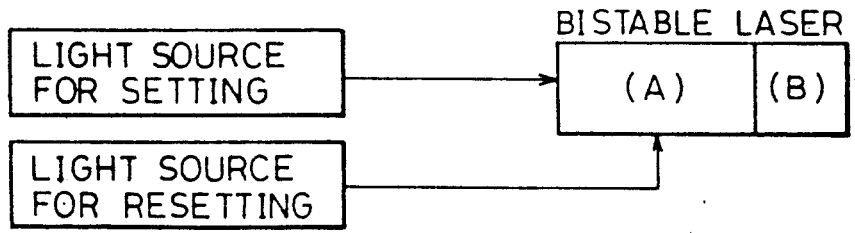
Figure 20C:
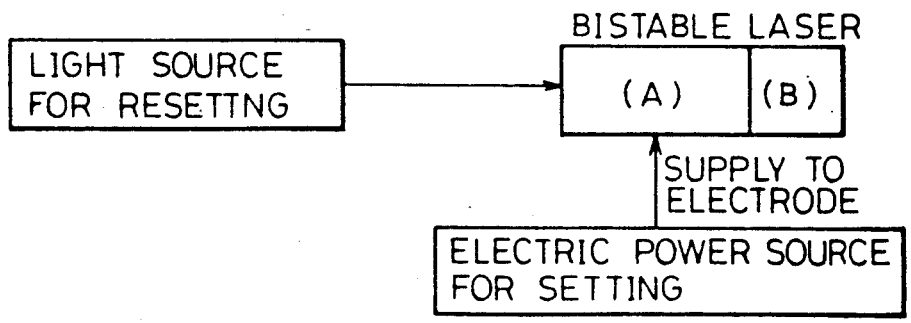

Examples of the types of the bistable semiconductor laser device of the present invention are shown in FIGS. 20A, 20B and 20C. As a first case, a bistable laser device operable in the "same axis" manner is illustrated. As a second case (Case-2, FIG. 20B), a bistable laser device operable in the "different axis" manner is illustrated. As a third case, a bistable laser device with the electrical setting and the optical resetting and operable in the "same axis" manner is illustrated.

Figure 21B:
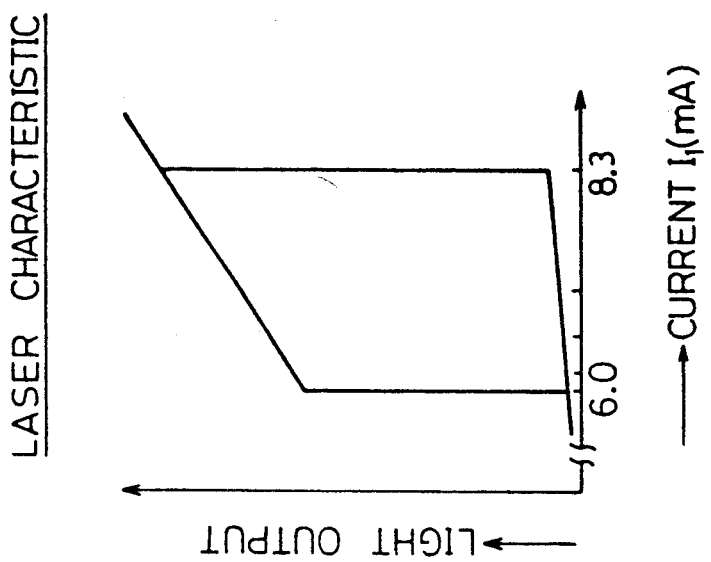
FIG. 21 shows an example of actual operations of the bistable semiconductor laser device according to an embodiment of the present invention in the "same axis" manner.
Figure 21A:
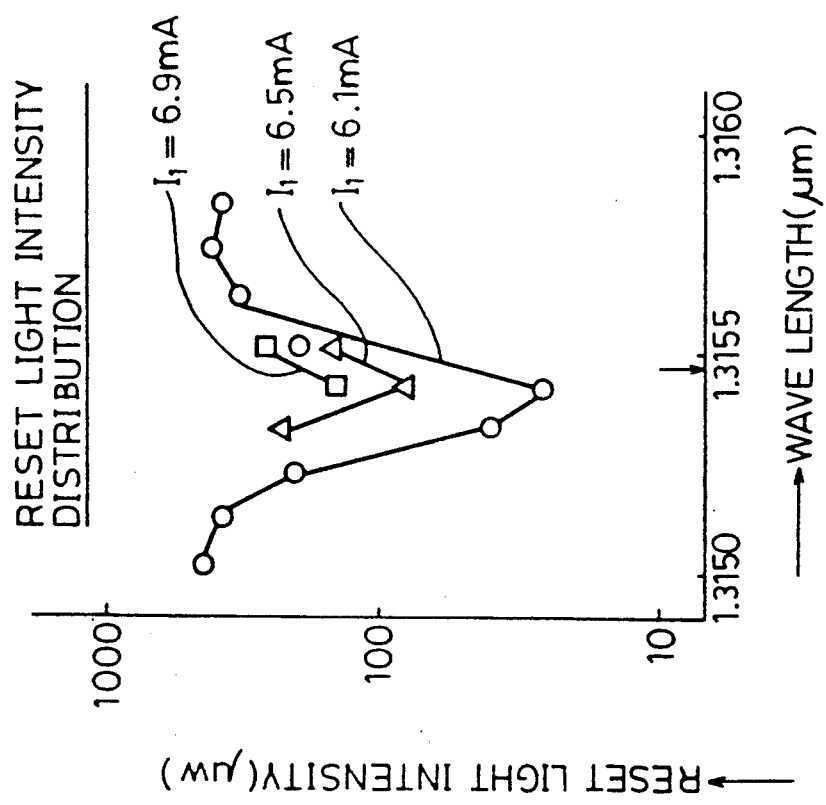

An example of actual operations of the bistable semiconductor laser diode device according to an embodiment of the present invention in the "same axis" manner is shown in the composite of FIGS. 21A and 21B. In FIGS. 21A and 21B, $I_1$ is the current, as a bias current, of one of the gain regions 1 and 2 in FIG. 11. The optical resetting of the device is carried out over 1 angstrom or 8 angstroms.

Figure 22:
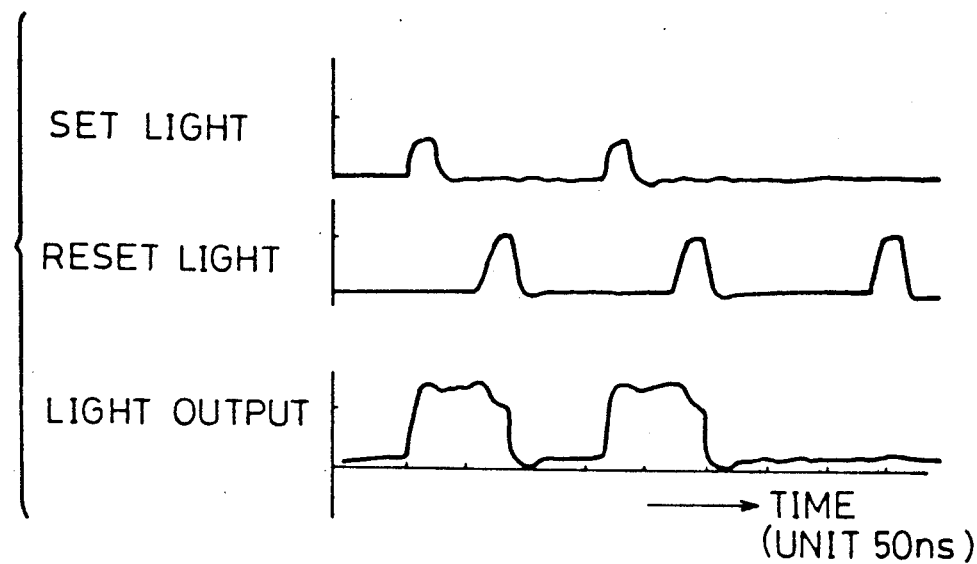
FIG. 22 shows an example of the actual light signal waveform.

An example of the respective, actual light signal waveforms for the set light, the reset light, and the light output are shown in FIG. 22. The wavelength of the lasing light output is 1.307 $\mu$m and the respective wavelengths of the set and reset lights are 1.3044 $\mu$m and 1.3154 $\mu$m.

Figure 23:
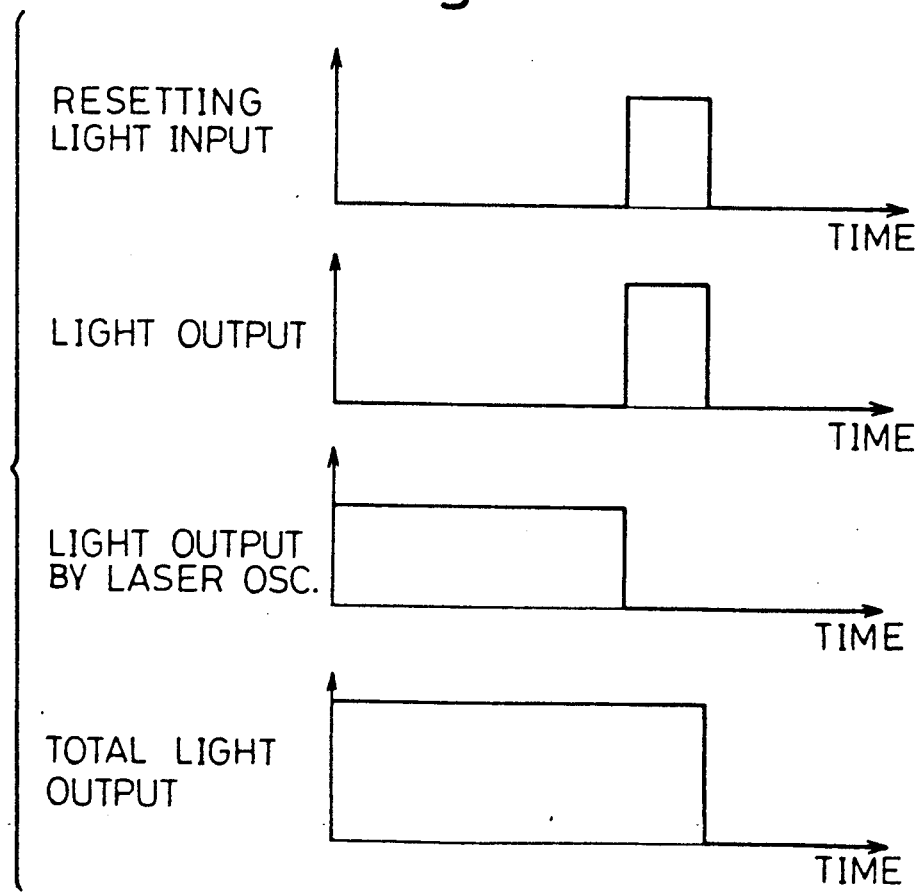
FIG. 23 is a diagram showing the operation of the resetting by inputting light in a bistable semiconductor laser device according to an embodiment of the present invention.

A diagram showing the operation of the resetting by light inputting in a bistable semiconductor laser diode device according to an embodiment of the present invention is shown in FIG. 23.

Figure 24:
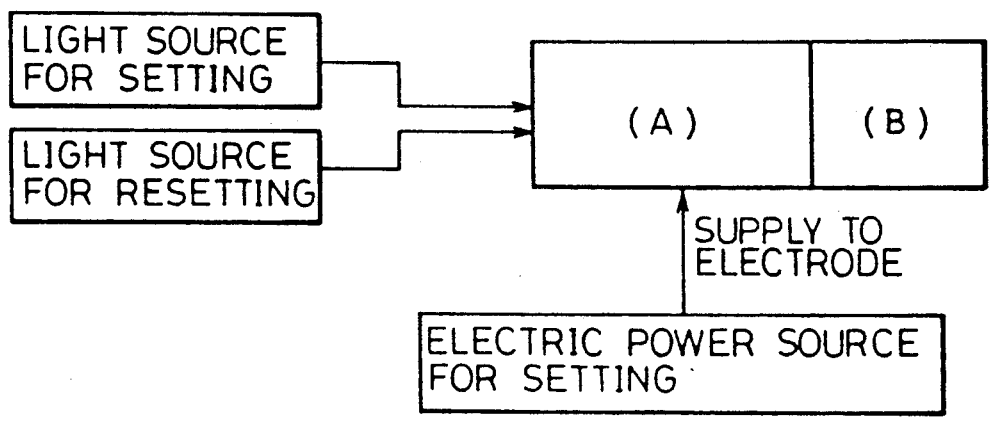
FIG. 24 shows an arrangement of the light signal inverter in accordance with an application of the laser device of the present invention.

An arrangement of the light signal inverter in accordance with an application of the laser diode device of the present invention is illustrated in FIG. 24.

Figure 25:
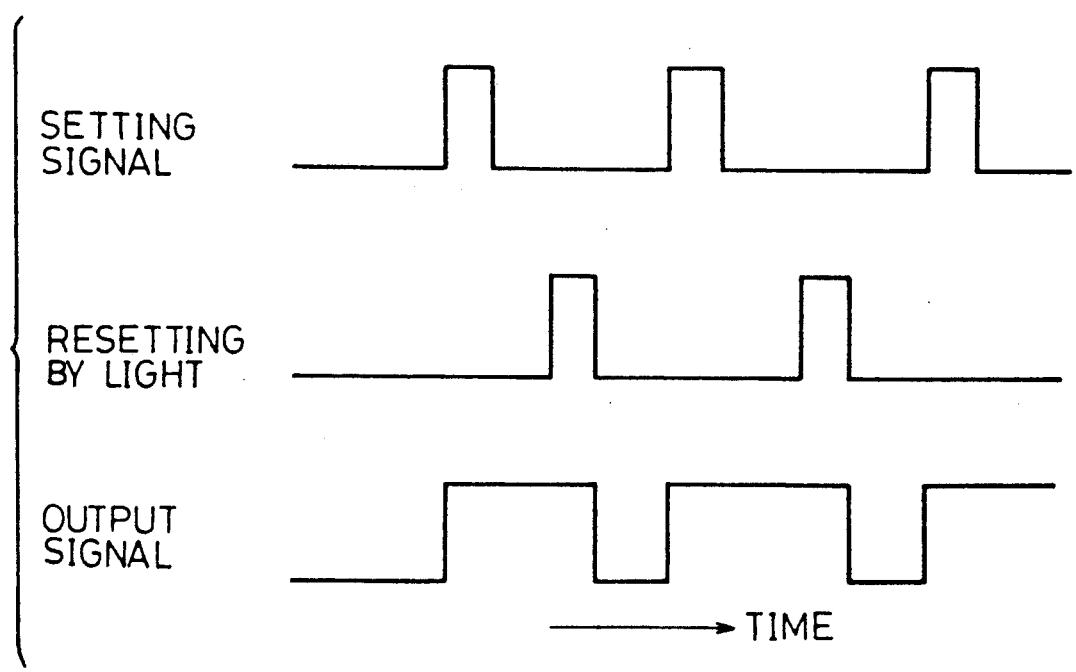
FIG. 25 shows an operation of the light signal inverter in accordance with an application of the laser device of the present invention; and The composite of FIGS. 26A and 26B shows an example of the characteristic of the optical set and the optical reset operations of the device according to an embodiment of the present invention.

An operation of the light signal inverter in accordance with an application of the laser diode device of the present invention is illustrated in FIG. 25.

An example of the characteristic of the optical set and the optical reset operation of the device according to an embodiment of the present invention is shown in the composite of FIGS. 26A and 26B.

The case (1) where two kinds of pulses having different light intensities and the same pulse-width are used is shown in FIG. 26A. The case (2) where two kinds of pulses having the same light intensity and different pulse-widths are used is shown in FIG. 26B. In the case (1), the pulse-width of the set/reset light is 30 ns, the light intensity of the set light is 50 $\mu$w, and the light intensity of the reset light is 250 $\mu$w. In the case (2), the light intensity of the set/reset light is 350 $\mu$w, the pulse-width of the set light is 10 ns, and the pulse-width of the reset light is 50 ns.

I claim:

1. A bistable semiconductor laser diode device comprising a laser which emits a lasing light at a predetermined lasing wavelength and is responsive to a reset light irradiated thereon by a light irradiation means to stop the emission of the lasing light therefrom, said laser comprising a laminated semiconductor structure having first and second, outer main surfaces and plural laminated layers therebetwen including an active layer comprising a gain region in which stimulated emission occurs thereby to afford an optical gain and a saturable absorption region in which no stimulated emission occurs thereby not to obtain an optical gain at the predetermined lasing wavelength, a first electrode provided on said first main surface, and second electrodes provided on said second main surface in correspondence with said gain region of said active layer, and means for supplying a bias current to said first and second electrodes and thereby through said laminated laser structure, resetting of said laser being carried out by irradiating a light from said irradiating means onto said gain region of said laser, said light having a wavelength in accordance with which said light, as thus irradiated onto the gain region, is amplified by stimulated emission thereby to reduce carriers in said gain region of said active layer of said laser.

2. A device according to claim 1, wherein clad layers having a refractive index smaller than that of said active layer are formed on both sides of said active layer, and carrier supply means are formed on said clad layers.

3. A device according to claim 1, wherein the reset light from said reset light irradiation means is irradiated onto said gain region of said active layer along the same axis as the light axis of the lasing light from said laser device.

4. A device according to claim 1, wherein the reset light from said reset light irradiation means is irradiated onto said gain region of said active layer along an axis different from the light axis of the lasing light from said laser device.

5. A device according to claim 1, wherein the setting of said laser device is carried out by supplying an electrical pulse to an electrode of said laser device.

6. A device according to claim 1, wherein reset light pulses are supplied as input signals to said laser device and the setting of said laser device is automatically carried out so that said device is operated as a light signal inverter.

7. A bistable semiconductor laser diode device comprising:
a bistable semiconductor laser, set light irradiation means for irradiating a set light onto said laser for causing emission of a lasing light from said laser, and reset light irradiation means for irradiating a reset light onto said laser for stopping the emission of the lasing light from said laser due to a reduction of carriers by amplification of light by stimulated emission;
said bistable semiconductor laser comprising an active layer having opposite main surfaces and consisting of a gain region having a portion to which carriers are supplied from outside and a saturable absorption region not having portions to which carriers are supplied from outside, clad layers formed on the respective, opposite main surfaces of said active layer and each said clad layer having a refractive index smaller than that of said active layer, and a carrier supply portion arranged on said clad layers in correspondence with said gain region portion to which the carriers are supplied; and
said reset light irradiation means being arranged to irradiate the reset light selectively onto a predetermined region of said active layer along a direction having a predetermined relationship with the lasing light axis of said laser, and said reset light having a wavelength and a border value of light intensity which satisfy a predetermined condition concerning the gain or the absorption in said gain region or said saturable absorption region and a predetermined relationship with regard to the border value (threshold) of set light intensity having the same wavelength as the wavelength of said reset light.

8. A device according to claim 7, wherein said reset light irradiation means is arranged to irradiate the reset light selectively only onto said gain region of said active layer along an axis different from the lasing light axis of said laser; and
said reset light has a wavelength at which the gain of said gain region is made positive and has a border value (threshold) of reset light intensity which is lower than a border value (threshold) of set light intensity having the same wavelength as the wavelength of said reset light to reduce the carrier concentration in said gain region.

9. A device according to claim 8, wherein said device is operated as a light signal inverter by supplying reset light pulses as input signals.

10. A device according to claim 7, wherein said reset light irradiation means is arranged to irradiate the reset light selectively only onto said saturable absorption region of said active layer along an axis different from the lasing light axis of said laser; and
said reset light has a wavelength at which the gain in said saturable absorption region is made positive and the border value (threshold) of reset light intensity is lower than the border value (threshold) of set light intensity at the same wavelength as the wavelength of said reset light to reduce the carrier concentration in said saturable absorption region.

11. A device according to claim 10, wherein said device is operated as a light signal inverter by supplying reset light pulses as input signals.

12. A device according to claim 7, wherein said reset light irradiation means is arranged to irradiate the reset light onto said active layer along an axis different from the oscillation light axis of said laser; and
said reset light has a wavelength at which the amplification in said gain region is greater than the absorption in said saturable absorption region and the border value (threshold) of reset light intensity is lower than the border value (threshold) of set light intensity at the same wavelength as the wavelength of said reset light to reduce the carrier concentration in said gain region.

13. A device according to claim 12, wherein said device is operated as a light signal inverter by supplying reset light pulses as input signals.

14. A device according to claim 7, wherein said reset light irradiation means is arranged to irradiate the reset light onto said active layer along the same axis as the oscillation light axis of said laser; and
said reset light has a wavelength longer than the wavelength of said lasing light and shorter than the gap wavelength determined by the energy gap of said active layer, and has a border value (threshold) lower than the border value (threshold) of set light intensity at the same wavelength as the wave length of said reset light, said wavelength of said reset light being of such a wavelength that the carriers in said gain region cannot follow the beat caused by interference between said lasing light and said reset light, to reduce the carrier concentration in said gain region.

15. A device according to claim 14, wherein said device is operated as a light signal inverter by supplying reset light pulses as input signals.

16. A bistable semiconductor laser diode device laminated structure of first and second, spaced main surfaces and including an active layer disposed between said main surfaces and comprising a gain region having a portion to which carriers are externally supplied and a saturable absorption region not having any portion to which carriers are externally supplied, a first electrode provided on said first main surface of said structure and a second electrode provided on said second main surface of said structure in correspondence with each said gain region of the active layer, and means for supplying a bias current through said first and second electrodes to said laser, the setting or resetting of said bistable semiconductor laser being carried out by irradiating onto said gain region of said laser a light having a wavelength, selectively around the border of a settable wavelength range or a resettable wavelength range, respectively to set or reset said bistable semiconductor laser, the resetting of said bistable semiconductor laser being carried out by a reduction of carriers by amplification of light by stimulated emission.

17. A device according to claim 16, wherein the wavelength of the light for setting or resetting is selected as a wavelength in the border range where the difference between the resonance wavelength in a non-lasing state of the laser and the resonance wavelength in a lasing state of the laser is 1 angstrom or less.

* * * * *

UNITED STATES PATENT AND TRADEMARK OFFICE
CERTIFICATE OF CORRECTION

PATENT NO. : 5,007,061
DATED : April 9, 1991
INVENTOR(S) : ODAGAWA

It is certified that error appears in the above-identified patent and that said Letters Patent is hereby corrected as shown below:

Col. 3,     line 22, after "onto" insert --the--;
              line 59, after "invention" insert --,--.

Col. 4,     line 19, change "example" to --examples--.

Col. 6,     line 65, change "rset" to --set--, and change "set" to --reset--.

Col. 7,     line 56, after "case" insert --(Case-1, FIG. 20A)--.

Signed and Sealed this

Thirteenth Day of July, 1993

Attest:

MICHAEL K. KIRK

*Attesting Officer*      *Acting Commissioner of Patents and Trademarks*